United States Patent [19]

Lewis

[11] 4,336,490
[45] Jun. 22, 1982

[54] VOLTAGE SENSING APPARATUS FOR A VOLTAGE REGULATING TRANSFORMER

[75] Inventor: Charles E. Lewis, Zanesville, Ohio

[73] Assignee: McGraw-Edison Company, Rolling Meadows, Ill.

[21] Appl. No.: 229,171

[22] Filed: Jan. 28, 1981

[51] Int. Cl.$^3$ .............................................. G05F 3/04
[52] U.S. Cl. .................................... 323/305; 323/256; 323/341
[58] Field of Search ................. 323/255, 256, 259, 260, 323/301, 305, 340, 344, 341, 359

[56] References Cited

U.S. PATENT DOCUMENTS

| 2,137,216 | 11/1938 | McCarty | 323/340 |
|---|---|---|---|
| 2,713,142 | 7/1955 | Sealey | |
| 3,054,943 | 9/1962 | Kettler et al. | |
| 3,184,677 | 5/1965 | Jacobsen | |
| 3,513,380 | 6/1968 | Vargo | 323/255 |
| 3,757,202 | 9/1973 | Prouty et al. | |
| 3,895,287 | 7/1975 | Sun et al. | |

FOREIGN PATENT DOCUMENTS 523131  3/1956  Canada ............................... 323/256

Primary Examiner—William M. Shoop

Attorney, Agent, or Firm—James A. Gabala; Jon C. Gealow

[57] ABSTRACT

An automatic voltage regulating transformer is provided which incorporates a potential transformer electrically disposed across its series windings, and a set of sensing windings disposed across its shunt windings to provide a voltage sensing network which is responsive to the flow of current both into and out of the transformer. The output of the potential transformer is connected in series with the sensing windings to provide a control voltage which is representative of the voltage across the shunt windings and series windings taken together. In the case of a normal voltage regulating transformer, this control voltage is proportional to the voltage across the output terminals. In the case of an inverted regulating transformer, the output voltage of the voltage sensing network is proportional to the voltage across the input terminals. In each case the same control voltage can be used to automatically operate the transformer whether or not current is flowing into or out of the input terminals of the transformer. In one embodiment the tertiary winding that is used to provide voltage to operate the tap changing mechanism of the transformer is also used to provide a voltage proportional to the voltage across the shunt windings.

15 Claims, 9 Drawing Figures

VOLTAGE SENSING APPARATUS FOR A VOLTAGE REGULATING TRANSFORMER

TECHNICAL FIELD

This invention is related to distribution transformers, particularly automatic voltage regulating transformers of the type employing a shunt winding and a variable or tapped series winding, the tapped positions of which are changed automatically in response to the voltage and current flowing through the transformer.

BACKGROUND OF THE INVENTION

In most power systems the voltage level will tend to vary due to several factors such as load, line capacitance or line resistance. This variation is disagreeable to the customer since it could result in poor performance or even equipment damage.

A step-voltage regulating transformer is a device which is often used to maintain the voltage of a system relatively constant. The voltage is maintained relatively constant by an apparatus which: (1) detects changes in the system voltage; and (2) automatically adjusts system voltage without interrupting service. An early step voltage regulating transformer is disclosed by Sealey in U.S. Pat. No. 2,713,142.

There are two techniques used by the regulator industry for sensing changes in system voltage. One technique, widely used by the industry, uses a tapped auto-transformer circuit. Normally, it consists of a tapped series winding on an auto-transformer that facilitates plus or minus 10 percent regulation; a shunt winding across the regulator input terminals; a potential winding closely coupled to the shunt winding; and a current transformer primary winding in the load line. A reversing switch that is always in either a "raise" or a "lower" position, depending on whether the regulator has been boosting or bucking the source voltage, is disposed across the ends of the series winding. With the reversing switch in the raise position, the series winding becomes additive with respect to the shunt winding as the number of turns placed in series with the load increases. The amount of voltage boost therefore increases. When the reversing switch is moved to the lower position, the series windings, therefore, become subtractive with respect to the shunt winding and the amount of voltage buck depends upon the number of turns placed in series with the load. An automatic circuit controls the amount of voltage boost or buck.

The potential winding is coupled to the shunt winding with a turns ratio depending upon the regulator voltage rating. Thus, the sensing signal (i.e. the voltage produced across the potential winding) is related to the input voltage or source voltage by the ratio of turns between the potential winding and the shunt winding. The output of the potential winding is an accurate reflection of changes in source voltage. Since the potential winding is wound as an integral part of the main transformer, this is a relatively inexpensive way of providing a sensing signal for the automatic adjusting circuit of the voltage regulator.

Another technique for sensing changes in system voltage employs a separate potential transformer. This transformer simply steps down the output voltage, which is subject to variations, to a usable level. Since a separate transformer is used, it must be designed for the full line voltage being regulated by the transformer. This is a much more expensive technique, relative to the method previously described. U.S. Pat. No. 3,054,943 to Kettler et al. and U.S. Pat. No. 3,184,677 to Jacobsen disclose two control circuits adopted to be used with such a potential transformer.

In both techniques, the automatic voltage regulator, or the automatic device which changes the tap settings of the series winding, is not responsive to voltage changes due to current flowing both into and out of the input terminals to the transformer. Those skilled in the art know that in the case of multiple feed systems or feed systems employing alternate power sources it is possible for reverse power flow to occur. Unless the automatic voltage regulating portion of the transformer is arranged to be responsive to current flowing in either direction, instability is likely to occur. The traditional solution to this problem has been to employ a separate potential transformer across the output terminals of the regulating transformer and to use a potential winding electromagnetically coupled to the shunt windings to sense the changes in the voltage supply to the input terminals. Power flow in one direction was then sensed by the potential transformer while power flow in the opposite direction was sensed by the potential winding.

What is needed is a simple, relatively inexpensive circuit which can be readily adapted to existing distribution transformer voltage regulating designs and which can be used to control the automatic regulating circuitry of the transformer whether or not current is flowing into or out of the input terminals of the transformer.

Preferably, existing windings and terminals would be used to the maximum extent possible. Such a circuit would reduce the size, weight and material requirements necessary to produce a transformer, the overall cost of the transformer, the cost of maintaining and using the transformer and would simplify the overall design of the automatic control circuitry of the transformer.

SUMMARY OF THE INVENTION

In accordance with the present invention, a voltage regulating transformer is provided with a circuit which senses the voltage across the input and output terminals of an autotransformer and which is suitable for controlling the transformer whether or not current is flowing into or out of the input terminals of the transformer. Specifically, a voltage regulating transformer of the type having: a set of input terminals and a set of output terminals with a shunt winding disposed across either the input or output terminals and a tapped series winding connected in series with the shunt winding such that both windings are disposed across the other set of terminals; a potential transformer means, such as a potential transformer, electrically connected across the series winding so as to produce a voltage output which is proportional to the voltage difference between the input and output terminals; and a sensing winding electromagnetically coupled to the shunt winding and joined in series with the potential transformer means in such a manner that the output voltage across the sensing winding and the potential transformer means, when added together, is equivalent to that voltage which would be obtained if a potential transformer with a first turns ratio was electrically connected directly across the input or output terminals respectively, and is representative of the voltage across the input terminals due to current flowing either into or out of the input terminals.

Thus, the same circuit can be used to automatically control the transformer.

Since the potential transformer measures the voltage across the series winding, a relatively small, lightweight, inexpensive potential transformer can be used. Most distribution voltage regulating transformers employ a tertiary winding to supply power to operate the electric motor which changes the tap settings on the series winding. The voltage across the tertiary winding is proportional to the voltage across the shunt winding of the transformer. Thus, no additional winding or equipment is necessary to sense the voltage across the shunt winding. By choosing the potential transformer with a turns ratio that is the same as the turns ratio between the tertiary winding and the shunt winding, the voltage across the tertiary winding can be combined with the output of potential transformer to produce a voltage which is electrically equivalent to that of a relatively large, expensive, heavy, potential transformer imposed directly across the input or output windings. Moreover, since the voltage across both the shunt winding and the series winding are sensed, the total output voltage across the tertiary winding and potential transformer is sensitive to current flow both into and out of the input terminals. Thus, the circuit possesses an inherent reverse power sensing capability.

Two specific embodiments are described in detail. In one embodiment, the series and shunt windings are electrically joined together across the input terminals. This is a so called "inverted" or "reverse" arrangement. In the second embodiment, the series winding and the shunt winding are joined together across the output terminals of the transformer. This is a so called "normal" arrangement. It is considered a normal arrangement in that autotransformers so configured generally produce a larger voltage across the output terminals than the voltage imposed or connected across the input terminals.

In either case, since a relatively small, inexpensive potential transformer is imposed across the series windings, and since the voltage across the series windings is, for the most part, a very small voltage compared to the total voltage across either the input or output terminals of the transformer, the accuracy of the voltage sensing circuit is much greater than that of a single, large, expensive, potential transformer imposed across either the input terminals or output terminals. Moreover, since the potential transformer is small, lightweight and inexpensive and since the tertiary windings are already present, the overall cost of producing the voltage sensing means in accordance with this invention is less than that of a conventional design. In addition, since the potential transformer measures a relatively small voltage, power losses are relatively small. Numerous other advantages and features of the present invention will become readily apparent from the following detailed description of the invention, the embodiments described, from the claims and from the accompanying drawings.

DETAILED DESCRIPTION OF THE PREFERRED EMBODIMENTS

Figure 1:
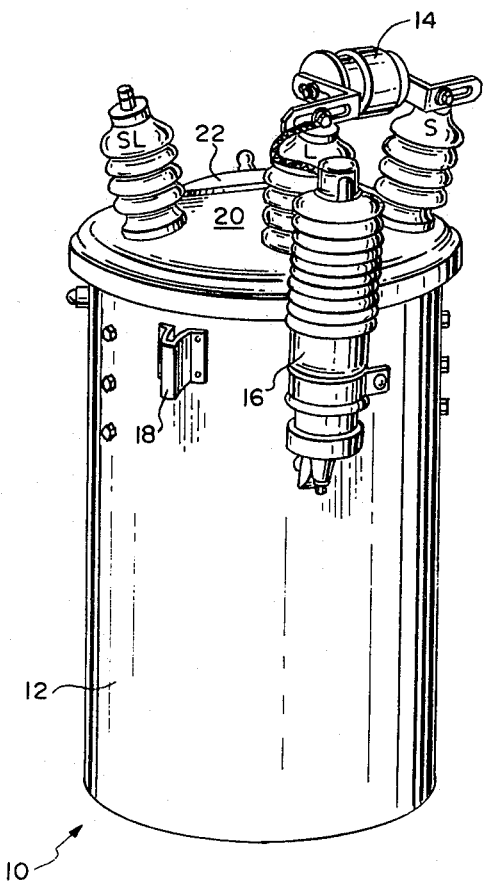
FIG. 1 is a perspective view of the exterior of a voltage regulating transformer of the type incorporating the present invention illustrating the input bushing S the neutral bushing SL and the output bushing L.

While this invention is susceptible of embodiment in many different forms, there is shown in the drawings and will herein be described in detail preferred embodiments of the invention. It should be understood, however, that the present disclosure is to be considered as an exemplification of the principles of the invention and is not intended to limit the invention to those specific embodiments illustrated.

FIG. 1 is a perspective view of a modern step-type voltage regulating transformer. These transformers are essentially autotransformers which define a tapped series winding electromagnetically coupled to a common shunt winding. Conventionally, the core and coils forming the transformer are securely mounted in an oil filled tank 12 with the necessary input and output terminals brought out through their appropriate bushings S, SL, and L. A series surge arrestor 14 and a shunt surge arrestor 16 are often provided to protect the series winding and the shunt windings respectively. These windings will be described in detail at a later point in this discussion. An electronic control system (see FIG. 4) automatically changes the ratio of the number of turns on the series winding to the number of turns on the shunt windings to control the output of the transformer 10. The tank 12 is provided with a suitable connector (not shown) for grounding and a set of lifting lugs 18 (only one being shown) for ease of handling. Finally, the tank 12 is sealed with a cover 20 which is provided with a handhole 22 for ease of inspection and maintainance.

Figure 2B:
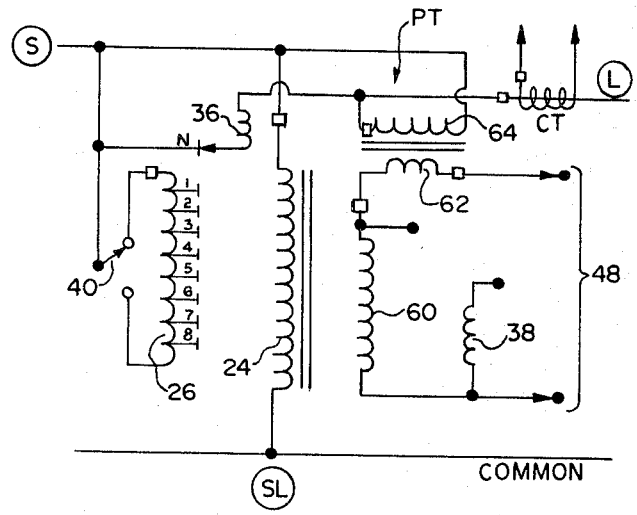
FIGS. 2B and 2C are simplified schematic diagrams of the electrical circuit illustrated in FIG. 2A.
Figure 2C:
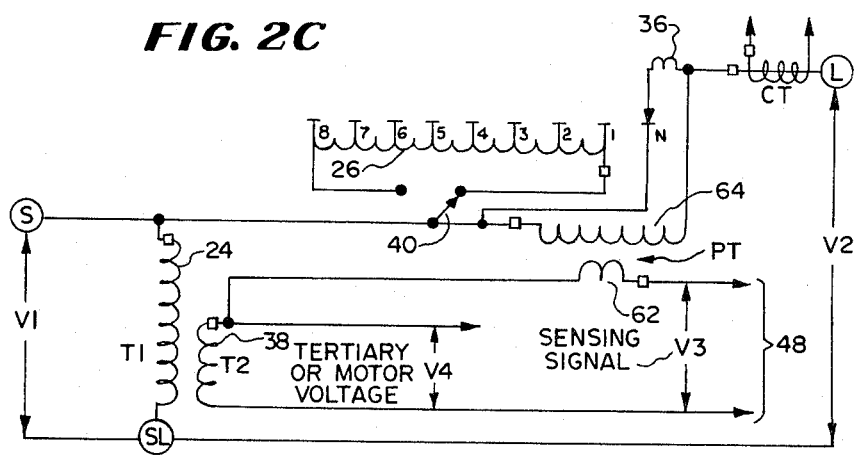
Figure 2A:
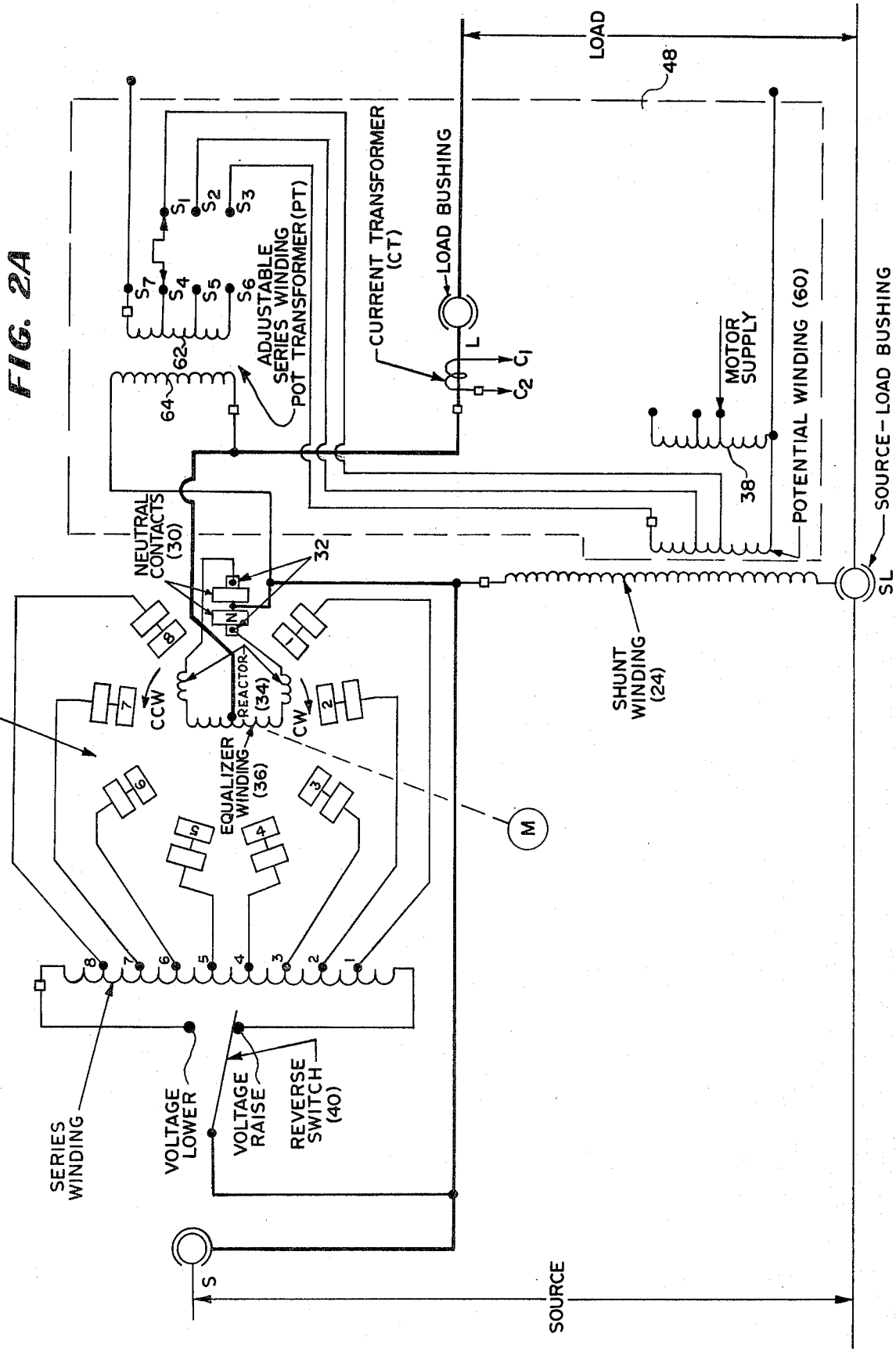
FIG. 2A is a schematic diagram of a portion of the electrical circuit forming the voltage regulating transformer shown in FIG. 1.

FIG. 2A is a detailed schematic diagram of a portion of the electrical circuitry encased within transformer tank 12 shown in FIG. 1. With the exception of the circuitry used to sense the voltage across the input terminals S and SL and the output terminals L and SL, the circuitry is, for the most part, conventional. Specifically, an autotransformer is formed from a shunt winding 24 and a tapped series winding 26. In FIG. 2A the shunt winding 24 is disposed directly across the source or input terminals S and SL. The shunt winding 24 and the series winding 26 are connected together in series across the load or output terminals L and SL. This is a so called "normal" arrangement. In an "inverted" arrangement the shunt winding 24 is disposed directly across the load or output terminals L or SL and the shunt winding and series winding 26 are connected together in series across the source or input terminals S and SL. A current transformer primary winding CT on the load line is used to sense the current flowing through the load. The current transformer CT, through its secondary winding (not shown), reflects any variations in the current flowing to the load out of the load bushing L.

As illustrated in FIG. 2A, the series winding 26 is provided with eight taps (numbered 1 through 8). These taps are brought out to eight pairs of fixed or stationary contacts. A pair of neutral contacts 30 are also provided. The neutral contacts are directly connected to the source bushing S and the upper end of the shunt winding 24. A reversing switch 40 is provided so that all of the series windings 26 are used in both the maximum buck or the maximum boost positions. The reversing switch 40 has a RAISE position and a LOWER position. An automatically controlled tap changer or tap changing mechanism 28 is used to connect the stationary contacts to the load bushing L. The automatically controlled tap changer 28 drives a set of moveable or rotating contacts 32 which are connected together by a two winding reactor 34 and an equalizer winding 36. The reactor 34, the equalizer winding 36, and the rotating contacts 32 insure that the voltage is changed without current interruption. The center of the equalizer winding 36 is tapped and joined to the load bushing L. Typically, a capacitor electric motor M is used to drive the automatically controlled tap changing mechanism 28. The electric motor M is powered by a tertiary winding 38 which is electromagnetically coupled to the shunt winding 24.

As the moveable or rotating contacts 32 of the automatically controlled tap changer 28 operate clockwise CW from the neutral position, the reversing switch 40 automatically shifts to the voltage raise position and the series winding 26 becomes additive with respect to the shunt winding 24 with the amount of voltage boost depending upon the number of turns placed in series with the source terminal S. The reversing switch 40 remains at the voltage raise position until the moveable contacts return to neutral. When the moveable contacts 32 move counter-clockwise CCW from neutral, the reversing switch 40 is automatically moved to the voltage lower position. In that position the series winding 26 becomes subtractive with respect to the shunt winding 24. The amount of voltage buck, of course, depends on the number of turns electrically connected in series with the input terminal S. The reversing switch 40 remains at the voltage lower position until the moveable contacts 32 return to neutral. Thus, the output of the transformer 10 is controlled by adjusting the number of turns electrically connected across the series winding 26.

Figure 4:
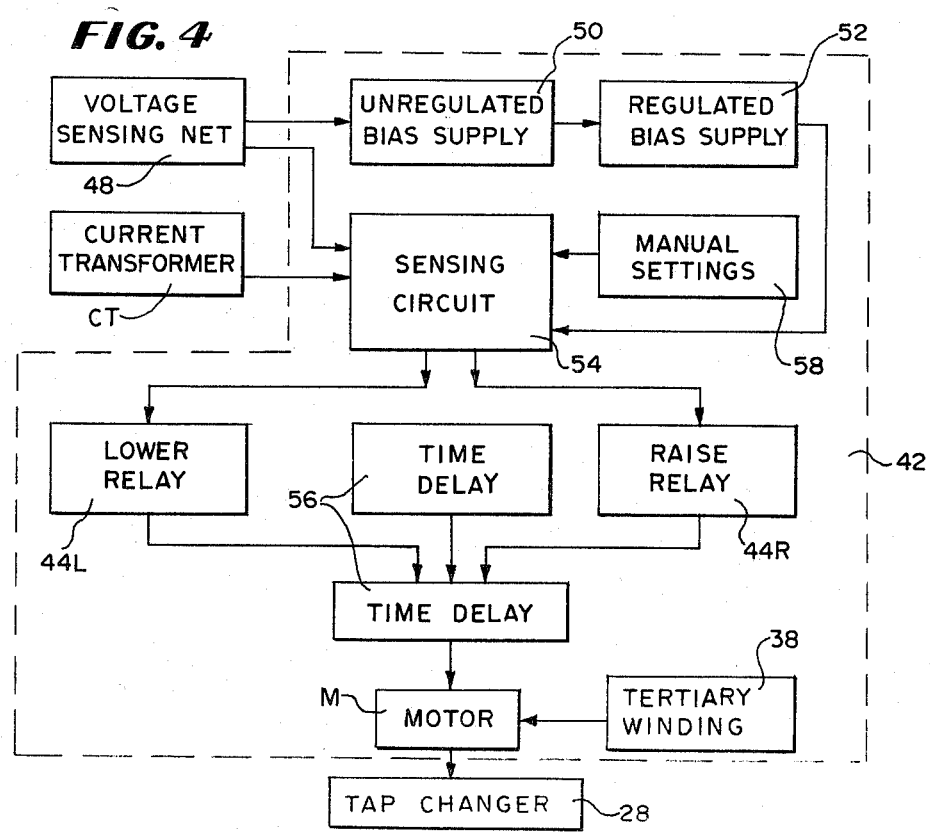
FIG. 4 is a block diagram of an automatic control circuit suitable for use in regulating the output voltage of the transformer shown in FIG. 1.

Before describing the remaining components of the circuit shown in FIG. 2A, a typical control circuit used to automatically control the output of the voltage regulating transformer will be described. FIG. 4 is a block diagram of such a circuit. The heart of the voltage regulating transformer 10 is the automatic control means 42. The automatic control means in most modern voltage regulating transformers is an electronic device incorporating integrated circuits, silicon controlled rectifiers and the like to change the tap settings on the series winding 26. U.S. Pat. No. 3,985,287 to Sun et al. and U.S. Pat. No. 3,757,202 to Prouty et al. disclose elementary control schemes. The automatic control means 42 is usually provided with manually operated controls 58 to set the output of the transformer 10.

The automatic control means 42 has two major parts or sections. An amplifying or switching section which is responsive to the load current and the output voltage across the transformer, and a motor drive circuit which responds to the switching section by closing relay contacts or actuating the electronic switches that cause the tap changing motor M to operate the set of rotating or moveable contacts 32.

Typically, one or more voltage transformers and windings are used to supply a source of voltage representative of the output of the voltage regulating transformer 10. This representative voltage is provided by a "voltage sensing network" 48. A portion of this output voltage is then tapped through a bridge rectifier to provide an unregulated bias supply 50. This bias voltage is in turn fed through an integrated circuit regulator to provide a regulated bias supply voltage 52. In FIG. 4 the main output from the voltage sensing network 48 is combined with the output from the current transformer CT (often through a line drop compensator and DC converter/filter circuits) to a control sensing circuit 54. In the control sensing circuit 54, the output voltage of the voltage sensing network 48 is compared with a reference voltage (often supplied by a circuit based on a differential amplifier). If the output voltage is out of the allowed band, relays 44L and 44R are closed to operate the automatically controlled tap changer 28. A time delay circuit 56 prevents the rotating contacts 32 from changing their position under transient voltage conditions.

Returning to FIG. 2A, the voltage sensing network 48, that is the subject of the present invention, is formed from a potential transformer means in the form of a potential transformer PT electrically disposed across the series winding 26 and a potential or sensing winding 60 electromagnetically disposed across the shunt winding 24 and electrically connected in series with the output of the potential transformer. FIG. 2A shows a potential transformer PT having a plurality of taps $S_1$ through $S_6$ on its secondary winding 62. These tapped positions are useful when the regulating transformer 10 is designed to be used with several source voltages. The position of the taps $S_1$ through $S_6$ is changed to provide an adequate voltage to operate the automatic control means 42 (see FIG. 4). By coupling the potential transformer PT with a tapped potential winding 60 so that the same turns ratio is maintained, the output of the two can be kept in the same relative proportion.

FIG. 2B is a simplified diagram of the circuit appearing in FIG. 2A. In FIG. 2C the basic circuit appearing in FIG. 2B has been further simplified and labeled to show the relationship between the voltage V1 across the shunt winding 24, and the voltage V3 across the output of the voltage sensing network 48. The input voltage V1 to the transformer 10 is applied across the shunt winding 24. The output voltage V2 is the combined voltage across the shunt winding 24 and those turns of the series winding 26 that are electrically connected in series with the shunt winding. Since a set of tertiary windings 38 (See FIG. 2A) are provided to operate the electric motor M, the voltage V4 at the output of the tertiary winding 38 is proportionate to the ratio of the number of turns T1 on the shunt winding 24 to the number of turns T2 on the tertiary winding. Thus, the tertiary winding 38 output voltage V4 is proportional to V1.

The potential transformer PT produces a voltage across its output windings 62 which is proportional to the voltage across its input windings 64, and since its input windings 64 are disposed across the series winding 26, the voltage across the output winding of potential transformer is proportional to the voltage difference (V2 minus V1) or (V1 minus V2) between the input terminals S and SL and the output terminals L and SL.

Thus, by selecting a potential transformer PT having a turns ratio the same as the turns ratio T1 to T2 between the shunt winding 24 and the tertiary winding 38, the total voltage across the potential transformer output winding 62 and the tertiary winding (i.e. the output of the voltage sensing network 48) is proportional to or representative of the voltage V1 across the input terminals S and SL. Since the tertiary windings 38 must be provided to operate an electric motor M driving the tap changing mechanism 28, the potential windings 60 shown in FIG. 2A can be eliminated for purposes of the automatic control means 42 (See FIG. 4). Moreover, since the voltage difference (V1 minus V2) or (V2 minus V1) between the input terminals S and SL and the output terminals L and SL is relatively small, a relatively small and inexpensive potential transformer PT can be used to perform this voltage sensing function. Heretofore, the only known method for obtaining such a voltage signal was to provide a relatively large and expensive potential transformer directly across the output terminals L and SL. (See U.S. Pat. No. 3,054,943 to Kettler et al. and U.S. Pat. No. 3,184,677 to Jacobsen).

Figure 2D:
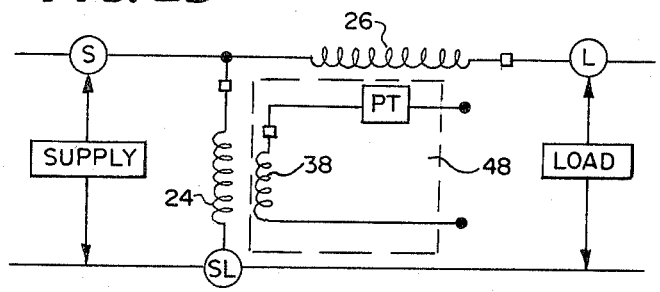
FIGS. 2D and 2E are equivalent circuit diagrams of the voltage sensing circuit that is the subject of the present invention.
Figure 2E:
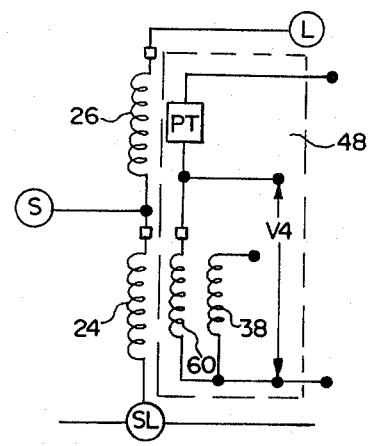
Figure 3A:
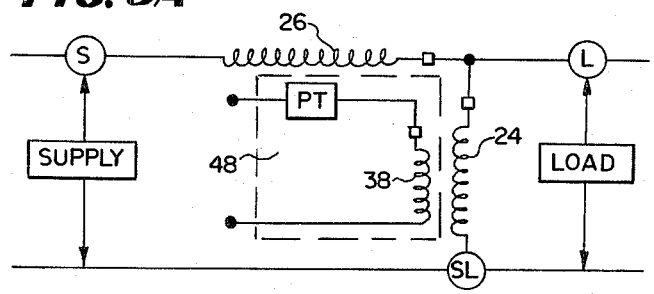
FIGS. 3A and 3B are equivalent circuit diagrams of the voltage sensing circuit that is the subject of the present invention for an inverted arrangement of the series and shunt windings.
Figure 3B:
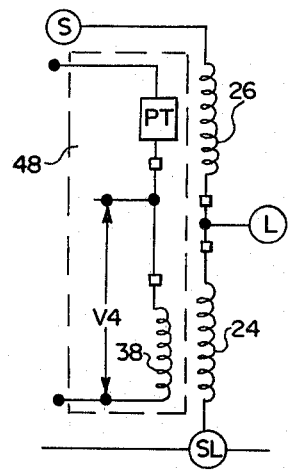

The significance of this arrangement becomes especially apparent when FIGS. 2D, 2E, 3A and 3B are studied. FIGS. 2D and 2E are equivalent circuit diagrams of the voltage sensing network 48 in relationship to the shunt winding 24 and the series winding 26 of a "normal" regulating transformer. In FIGS. 3A and 3B the series winding 26 and the shunt winding 24 are connected in an "inverted" relationship. In FIG. 2E the tertiary winding 38 that used to operate the tap changing motor M is shown as a separate and distinct element from the potential winding 60. In FIG. 3B the tertiary winding 38 performs both functions.

In either case, whether the shunt winding or the series winding are in a normal or an inverted relationship, since the output of the voltage sensing network 48 is representative of the voltage across the shunt winding 24 and the series winding 26, the voltage sensing network produces a voltage for automatically controlling the transformer whether or not current is flowing into or out of the input terminals S and SL. Thus, the automatic control means 42 when operated in response to the voltage sensing network 48 that is the subject of the present invention has been provided with a reverse power capability at very little cost. Significantly, this capability can be easily added to most existing voltage regulating transformer designs. Moreover, the basic voltage regulating transformer 10 can be manufactured with provision for a potential transformer and the reverse power capability as a customer's option. If the potential transformer PT is not installed, the voltage V4 across the tertiary or motor winding 38 can be used to operate the automatic control means 42 in the conventional manner. This gives the customer additional flexibility in that he can modify the voltage regulating transformer 10 at a later date to incorporate the reverse power capability when that capability proves useful. It is well known that utilities often refurbish and change distribution transformers from one location to another to meet the varying needs of their customers. Since it is much easier to control an inventory of distribution transformers if those distribution transformers can be used for a variety of customers with relatively little modification, the invention will be well received by electric utilities and other users of voltage regulating transformers.

It also should be appreciated that the accuracy of the voltage sensing network 48 that is the subject of the present invention is better than that of a voltage sensing network that simply employs a large potential transformer disposed across the output terminals. Since the potential transformer PT "sees" a relatively small voltage compared to the total voltage across the input or output terminals of the regulating transformer 10, the power loss of the potential transformer is small. Thus, the overall accuracy of the voltage sensing network 48 is large. In fact, if the tap changing mechanism 28 is in its neutral position, the potential transformer experiences little, if any, losses. This is in contrast to a large potential transformer disposed across the input or output terminals of the regulating transformer 10. In the latter case, power losses are high regardless of the position of the tap changing mechanism 28.

From the foregoing, it will be observed that numerous variations and modifications may be effected without departing from the true spirit and scope of the novel concept of the invention. It is to be understood that no limitation with respect to the specific apparatus illustrated herein is intended or should be inferred. It is, of course, intended to cover by the appended claims all of such variations and modifications.

What is claimed is as follows:

1. Bidirectional voltage sensing apparatus for sensing the voltage across the input and output terminals of a voltage regulating transformer having a shunt winding, a tapped series winding electrically and magnetically connected to said shunt winding, a tap changing mechanism for said series winding, and automatic control means which operates in response to a voltage signal representative of the voltage across said output terminals for controlling said tap changing mechanism to produce a preselected voltage across said output terminals, said bidirectional voltage sensing apparatus, comprising:
   a sensing winding electromagnetically coupled to said shunt winding and having a predetermined turns ratio with respect to said shunt winding; and
   potential means, electrically connected across the energized portion of said series winding, for producing a control voltage related to the voltage across said series winding by said predetermined turns ratio,
   said sensing winding and said potential means being electrically connected in series such that the voltage across said sensing winding and said control voltage when taken together produces a total voltage which is representative of the voltage across said shunt and series windings, whereby the automatic control means can be operated in response to said total voltage to control the voltage across said output terminals with current flowing either into or out of said input terminals.

2. An automatic voltage regulating transformer, comprising: a set of input terminals and a set of output terminals; a shunt winding disposed across one of said set of input terminals and output terminals; a tapped series winding electrically connected in series with said shunt winding such that both windings are disposed across the other of said set of input terminals and output terminals, said shunt winding and said series winding forming an autotransformer; automatic means, responsive to a voltage signal representative of the voltage across said set of output terminals, for changing the number of turns of said tapped series winding electromagnetically coupled to said shunt winding to produce a predetermined voltage across said output terminals, said automatic means including electric motor means for changing the electrical position of one of the terminals of said other set of terminals relative to the taps on said series winding; potential transformer means, electrically coupled to said series winding, for producing a voltage output proportional to the difference in voltage across said set of input terminals and said set of output terminals, said potential transformer means defining a first turns ratio; and a motor supply winding, electromagnetically coupled to said shunt winding by said first turns ratio and electrically connected in series with the output of said potential transformer means, for supplying power to run said electric motor means, the total voltage across said motor supply winding and the output of said potential transformer means being equivalent to that voltage which would be obtained if a potential transformer with a first turns ratio were connected directly across said other set of terminals, said total voltage being suitable for use in operating said automatic means, without regard to the direction of current flow through said input terminals.

3. In a voltage regulating transformer of a type having a set of input terminals and a set of output terminals, a shunt winding disposed across said input terminals, a series winding connected in series with said shunt winding such that both windings are disposed across said output terminals, a bidirectional voltage sensing apparatus for sensing the difference in voltage across said input terminals and said output terminals, comprising:
  potential transformer means, coupled to said series winding, for producing a voltage output proportional to the voltage difference between said input terminals and said output terminals, said potential transformer means defining a first turns ratio; and
  a sensing winding electromagnetically coupled to said shunt winding by said first turns ratio and electrically connected in series with said potential transformer means output,
  whereby the total voltage across said sensing winding and said potential transformer means additively taken together is equivalent to that voltage which would be obtained if a potential transformer with a first turns ratio were electrically coupled directly across said output terminals, and is responsive to the voltage across said input terminals due to current flowing either into or out of said input terminals.

4. The voltage sensing apparatus set forth in claim 3, wherein said series winding is provided with a plurality of voltage taps with one of said output terminals being selectively connected to one of said taps, whereby the voltage across said output terminals is adjustable.

5. The voltage sensing apparatus set forth in claim 4, wherein said voltage regulating transformer includes automatic means, responsive to the total voltage across said sensing winding and potential transformer means, for changing the electrical position of said one output terminal relative to said plurality of voltage taps in response to the voltage across said output terminals, whereby said automatic means is responsive to reverse power flow.

6. In a voltage regulating transformer of the type having a set of input terminals and a set of output terminals with a first winding disposed across said input terminals and a second winding electrically in series with said first winding such that both said first winding and said second winding are electrically disposed together across said output terminals and electromagnetically coupled together, a method for sensing the voltage across said input terminals and said output terminals due to current flowing either into or out of said input terminals, comprising the steps of:
  a. electromagnetically coupling a third winding to said first winding such that said first winding and said third winding are related by a first turns ration;
  b. electromagnetically coupling a fourth winding to said second winding, said second winding and said fourth winding being related by said first turns ratio, whereby the voltage across said fourth winding is proportional to the difference between the voltage across said input terminals and said output terminals; and
  c. electrically connecting said third winding and said fourth winding in series, whereby the voltage across said third winding and said fourth winding taken together is proportional to the voltage across said output terminals.

7. The method set forth in claim 6, wherein said third winding is electromagnetically coupled to said first winding by wrapping said first winding and said third winding together about a common core.

8. The method set forth in claim 7, wherein said fourth winding is electromagnetically coupled to said second winding by means of a potential transformer electrically connected in parallel across said second winding, the input voltage to said potential transformer being representative of the voltage difference between said input terminals and said output terminals, said potential transformer output voltage being related to its input voltage by said first turns ratio.

9. In a voltage regulating transformer of a type having a set of output terminals and a set of input terminals, a shunt winding disposed across said output terminals, a series winding connected in series with said shunt winding such that both windings are disposed across said output terminals, a bidirectional voltage sensing apparatus for sensing the difference in voltage across said input terminals and said output terminals, comprising:
  potential transformer means, coupled to said series winding, for producing a voltage output proportional to the voltage difference between said output terminals and said input terminals, said potential transformer means defining a first turns ratio; and
  a sensing winding electromagnetically coupled to said shunt winding by said first turns ratio, and electrically connected in series with said potential tranformer means output,
  whereby the total voltage across said sensing winding and said potential transformer means additively taken together is equivalent to that voltage which would be obtained if a potential transformer with a first turns ratio where electrically coupled directly across said input terminals, and is responsive to the voltage across said input terminals due to current flowing either into or out of said input terminals.

10. The voltage sensing apparatus set forth in claim 9, wherein said series winding is provided with a plurality of voltage taps with one of said input terminals being selectively connected to one of said taps, whereby the voltage across said output terminals is adjustable.

11. The voltage sensing apparatus set forth in claim 10, wherein said voltage regulating transformer includes automatic means, responsive to the total voltage across said sensing winding and potential transformer means, for changing the electrical position of said one input terminal relative to said plurality of voltage taps in response to the voltage across said output terminals, whereby said automatic means is responsive to reverse power flow.

12. The voltage sensing apparatus set forth in claim 5 or 11, wherein said automatic means includes an electric motor electrically powered by the voltage produced across said sensing winding.

13. In a voltage regulating transformer of the type having a set of input terminals and a set of output terminals with a first winding disposed across said output terminals and a second winding electrically in series with said first winding such that both said first winding and said second winding are electrically disposed together across said input terminals and electromagnetically coupled together, a method for producing a voltage representative of the voltage across said input terminals and said output terminals, comprising the steps of:

a. electromagnetically coupling a third winding to said first winding such that said first winding and said third winding are related by a first turns ration;

b. electromagnetically coupling a fourth winding to said second winding, said second winding and said fourth winding being related by said first turns ratio, whereby the voltage across said fourth winding is proportional to the difference between the voltage across said input terminals and said output terminals; and c. electrically connecting said third winding and said fourth winding in series, whereby the voltage across said third winding and said fourth winding taken together is representative of the voltage across said input and output terminals without regard to the direction of current flow across said input terminals.

14. The method set forth in claim 13, wherein said third winding is electromagnetically coupled to said first winding by wrapping said first winding and said third winding together about a common core.

15. The method set forth in claim 14, wherein said fourth winding is electromagnetically coupled to said second winding by means of a potential transformer electrically connected in parallel across said second winding, the input voltage to said potential transformer being representative of the voltage difference between said input terminals and said output terminals, said potential transformer output voltage being related to its input voltage by said first turns ratio.

* * * * *